(12) United States Patent
Kartschoke et al.

(10) Patent No.: US 9,223,918 B2
(45) Date of Patent: Dec. 29, 2015

(54) REDUCING REPEATER POWER

(75) Inventors: Paul D. Kartschoke, Williston, VT (US); Adam P. Matheny, Beacon, NY (US); Jose L. Neves, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 299 days.

(21) Appl. No.: 13/447,751

(22) Filed: Apr. 16, 2012

(65) Prior Publication Data

US 2013/0275110 A1 Oct. 17, 2013

(51) Int. Cl.
*G06F 17/50* (2006.01)

(52) U.S. Cl.
CPC ........ *G06F 17/5045* (2013.01); *G06F 17/5031* (2013.01); *G06F 17/5036* (2013.01)

(58) Field of Classification Search
USPC ..................... 703/14; 716/114, 115, 134, 135
See application file for complete search history.

(56) References Cited

U.S. PATENT DOCUMENTS

| | | | |
|---|---|---|---|
| 6,405,350 B1 | 6/2002 | Tawada | |
| 6,721,924 B2 | 4/2004 | Patra et al. | |
| 6,820,240 B2 | 11/2004 | Bednar et al. | |
| 7,181,711 B2 | 2/2007 | Foreman et al. | |
| 7,376,916 B1 | 5/2008 | Ebergen et al. | |
| 7,549,134 B1 * | 6/2009 | Li et al. | 716/115 |
| 7,653,885 B2 * | 1/2010 | Nandy et al. | 716/133 |
| 7,725,848 B2 | 5/2010 | Nebel et al. | |
| 7,895,556 B2 | 2/2011 | Kotecha et al. | |
| 8,020,129 B2 | 9/2011 | Abbaspour et al. | |
| 2003/0229869 A1 * | 12/2003 | Yang et al. | 716/5 |
| 2006/0112357 A1 | 5/2006 | Nazarian et al. | |
| 2008/0172642 A1 * | 7/2008 | Abbaspour et al. | 716/6 |
| 2010/0128760 A1 * | 5/2010 | Ballard et al. | 375/214 |
| 2011/0185333 A1 * | 7/2011 | Iyer et al. | 716/133 |

OTHER PUBLICATIONS

X. Liu et al., "Practical Repeater Insertion for Low Power: What Repeater Library Do We Need?" May 2006, IEEE Transactions on Computer-Aided Design of Integrated Circuits and Systems, vol. 25, No. 5, pp. 917-924.*

Y. Peng and X. Liu, "Freeze: Engineering a Fast Repeater Insertion Solver for Power Minimization Using the Ellipsoid Method," DAC 2005, Jun. 13-17, 2005, Anaheim, CA, USA, pp. 813-818.*

(Continued)

*Primary Examiner* — Omar Fernandez Rivas
*Assistant Examiner* — Bernard E Cothran
(74) *Attorney, Agent, or Firm* — Cantor Colburn LLP

(57) ABSTRACT

A method, system and computer-readable medium for reducing repeater power and crosstalk are provided. The method includes generating a model of a circuit including a plurality of original repeaters connected between at least one source and at least one sink, performing a power optimization analysis on the plurality of original repeaters to change the plurality of original repeaters to low-power repeaters based on predetermined optimization parameters, performing a crosstalk analysis on the model of the circuit including the low-power repeaters to determine whether a crosstalk timing violation exists, and changing at least one of the low-power repeaters to a higher-power repeater when it is determined that a crosstalk violation exists, and leaving the low-power repeaters in the model of the circuit when it is determined that a crosstalk violation does not exist.

14 Claims, 6 Drawing Sheets

(56) References Cited

OTHER PUBLICATIONS

A. Nalamalpu and W. Burleson, "A Practical Approach to DSM Repeater Insertion: Satisfying Delay Constraints while Minimizing Area and Power," 14th Annual IEEE International ASIC/SOC Conference Proceedings, Sep. 12-15, 2001, pp. 152-156.*

Y. Peng and X. Liu, "Low-Power Repeater Insertion With Both Delay and Slew Rate Constraints," DAC 2006, Jul. 24-28, 2006, San Francisco, CA, USA, pp. 302-307.*

Y. Chang et al., "Power-optimal Repeater Insertion Considering Vdd and Vth as Design Freedoms," ISLPED '05, Aug. 8-10, 2005, San Diego, CA, USA, pp. 137-142.*

D.E. Lackey et al., "Designing Mega-ASICs in Nanogate Technologies," Proceedings Design Automation Conference, Jun. 2-6, 2003, pp. 770-775.

D.E. Lackey et al., "Managing Power and Performance for System-On-Chip Designs Using Voltage Islands," IEEE/ACM International Conference on Computer Aided Design, ICCAD, Nov. 10-14, 2002, pp, 195-202.

D. Dal et al., "Power Optimization with Power Islands Synthesis," IEEE Transactions on Computer-Aided Design of Integrated Circuits and Systems, vol. 28, Issue 7, Jul. 2009, pp. 1025-1037.

\* cited by examiner

REDUCING REPEATER POWER

BACKGROUND

The present disclosure relates generally to a system and method of reducing repeater power, particularly within a crosstalk noise environment.

Due to continued silicon technology evolution in shrinking feature size and increased chip size, the number of transistors on microprocessors continues to increase. Digital microprocessor operation translates into switching on and/or off transistors at frequencies reaching several GHz. At any time, even if the switching occurs on just a fraction of the billions of transistors, increasing amounts of power are consumed. This power increase has adverse effects in chip operation, reliability and manufacturing cost due to the need of complex cooling systems. As such there is a very concerted effort to reduce power in modern GHz microprocessor and integrated circuits to keep such designs within pre-defined system power targets.

However, reducing the power of components of the integrated circuits may affect crosstalk characteristics of the integrated circuit by changing the timing of signals in the integrated circuit.

SUMMARY

An exemplary embodiment of the disclosure includes a method comprising generating a model of a circuit including a plurality of original repeaters connected between at least one source and at least one sink, performing a power optimization analysis on the plurality of original repeaters to change the plurality of original repeaters to low-power repeaters based on predetermined optimization parameters, performing a crosstalk analysis on the model of the circuit including the low-power repeaters to determine whether a crosstalk timing violation exists, and changing at least one of the low-power repeaters to a higher-power repeater when it is determined that a crosstalk violation exists, and leaving the low-power repeaters in the model of the circuit when it is determined that a crosstalk violation does not exist.

Another exemplary embodiment includes a computer-readable medium having stored thereon a code to execute a method, the method comprising generating a model of a circuit including a plurality of original repeaters connected between at least one source and at least one sink, performing a power optimization analysis on the plurality of original repeaters to change the plurality of original repeaters to low-power repeaters based on predetermined optimization parameters, performing a crosstalk analysis on the model of the circuit including the low-power repeaters to determine whether a crosstalk timing violation exists, and changing at least one of the low-power repeaters to a higher-power repeater when it is determined that a crosstalk violation exists, and leaving the low-power repeaters in the model of the circuit when it is determined that a crosstalk violation does not exist.

A further exemplary embodiment is a system, comprising a power optimization analysis unit configured to receive a circuit model and to perform a power optimization analysis on a plurality of original repeaters in the circuit model to change the plurality of original repeaters to low-power repeaters based on predetermined optimization parameters, and a crosstalk analysis unit configured to perform a crosstalk analysis on the model of the circuit including the low-power repeaters to determine whether a crosstalk timing violation exists, to change at least one of the low-power repeaters to a higher-power repeater when it is determined that a crosstalk violation exists, and to leave the low-power repeaters in the model of the circuit when it is determined that a crosstalk violation does not exist.

Additional features and advantages are realized through the techniques of the present disclosure. Other embodiments and aspects of the disclosure are described in detail herein and are considered a part of the claims. For a better understanding of the disclosure with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
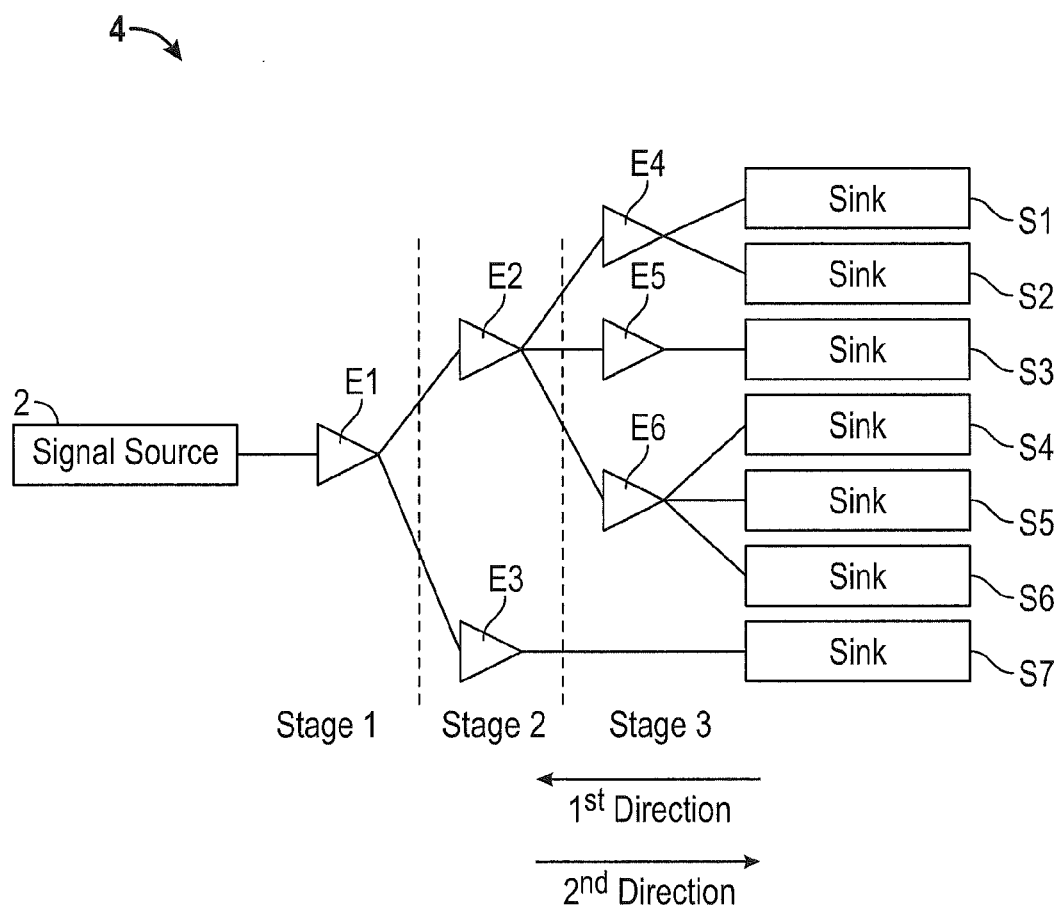
FIG. 1 depicts a hierarchal model of a circuit.

FIG. 1 is a block diagram representing a circuit including buffers, or repeaters, E1-E6, a signal source 2, and sinks S1-S7. The net of repeaters E1-E6, signal source 2, and sinks S1-S7 is represented as a tree 4. The tree 4 illustrated in FIG. 1 includes a first repeater E1 receiving as an input a signal from the signal source 2, a second repeater E2 and a third repeater E3 receiving as inputs an output from the first repeater E1, and fourth, fifth, and sixth repeaters E4-E6 receiving as inputs an output from the second repeater E2. Each of the repeaters E3-E6 is connected to one or more sinks S1-S7, representing destinations of a signal from the signal source 2.

In the present specification and claims, a net is defined as at least two interconnected components, and a tree is defined as a net that has one or more buffers to connect a source to one or more sinks. For example, the path from the source 2, through the repeaters E1, E2, and E4 to the sink S1 may be considered a net, and the interconnection of the source 2, repeaters E1-E6 and sinks S1-S6 may also be considered a net.

In the tree 4, the repeaters E1-E6 draw a predetermined level of power, and crosstalk may occur on the lines connecting the repeaters E1-E6 to each other or to the signal source 2 or the sinks S1-S7. Crosstalk occurs when a signal along one or more lines, referred to as the aggressor(s), switches and causes a switch in a signal of an adjacent line, known as the victim. In embodiments of the present disclosure, crosstalk analysis is performed during a power reduction operation to reduce power in the net 4 while preventing crosstalk.

Figure 2:
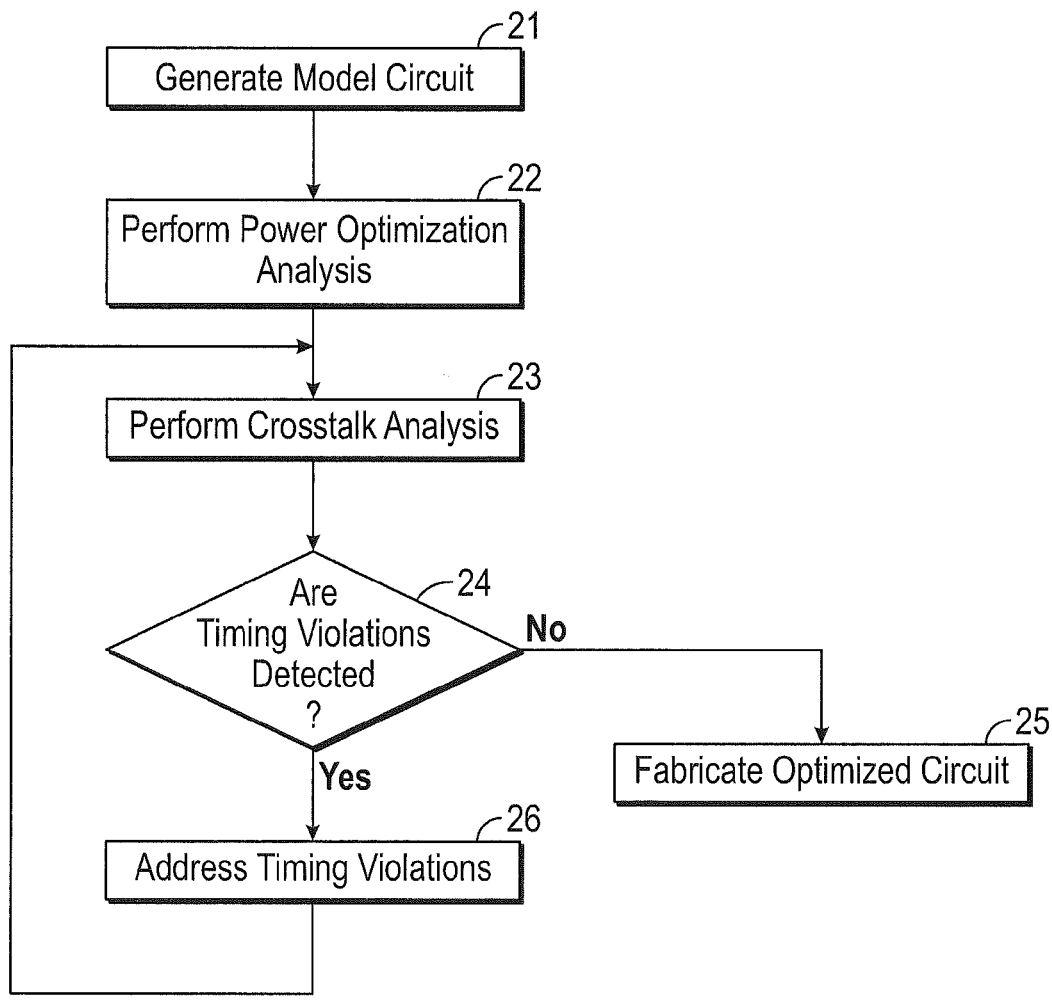
FIG. 2 is a flowchart of a method of optimizing power and reducing crosstalk according to one embodiment.

FIG. 2 is a flow diagram of a method of reducing crosstalk and power consumption in a net according to embodiments of the disclosure. In operation 21, a model of a circuit is generated and a crosstalk analysis is performed on the model. The circuit design may be, for example, a software modeling of an actual circuit prior to fabricating the actual circuit. The design may include one or more repeaters E1-E6, and for purposes of describing the present embodiment, the circuit illustrated in FIG. 1 will be referred to as an example.

In operation 22, a power optimization analysis is performed. The power optimization analysis may include one or more of a swapping process (or repeater-swap) and a power down process. The swapping process will be described in greater detail with respect to FIG. 3, and the power down process will be described in greater detail with respect to FIG. 4.

Figure 3:
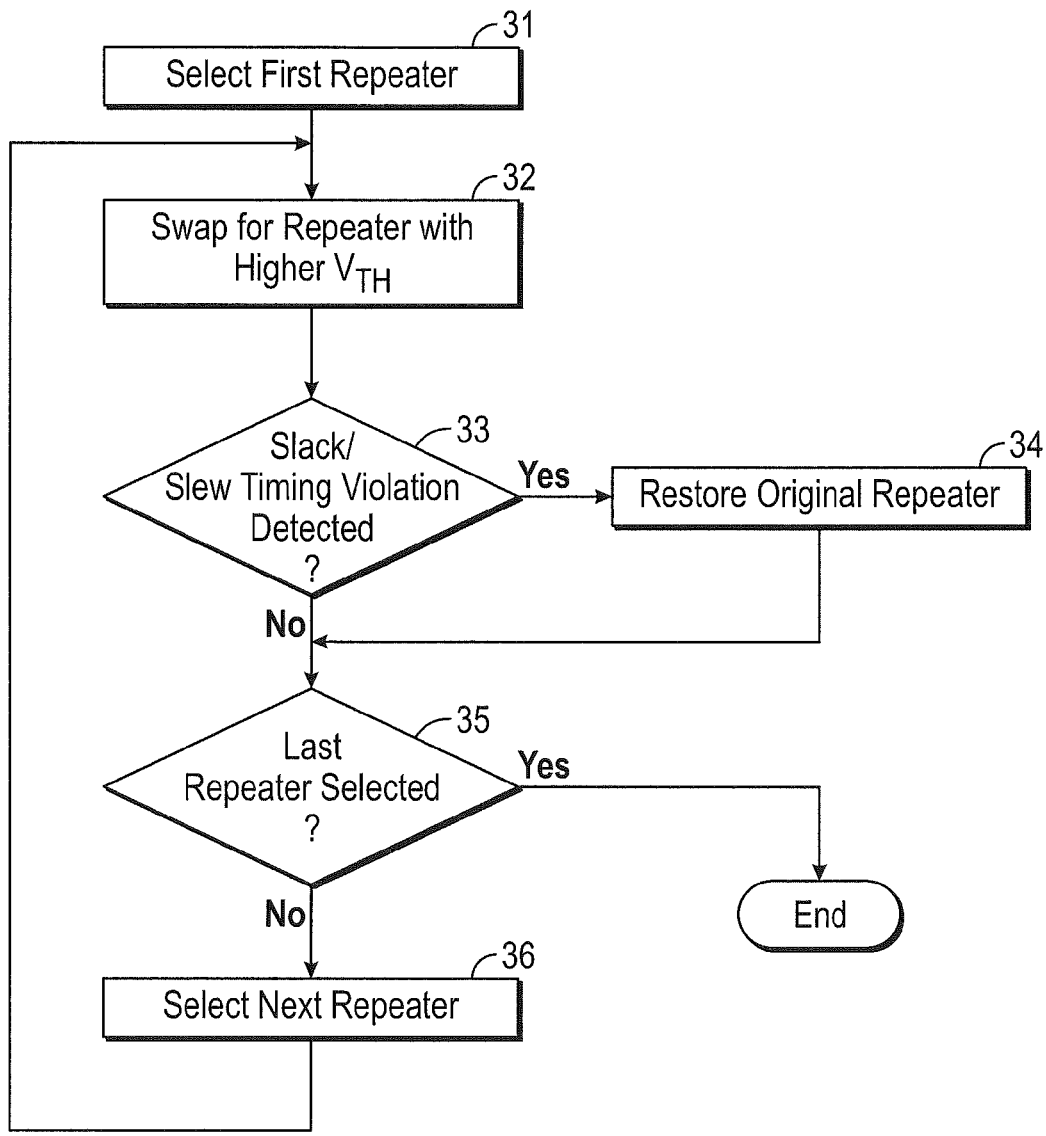
FIG. 3 is a flowchart of a method of optimizing power according to one embodiment.

Referring to FIG. 3, in the swapping process, a first repeater is selected in operation 31 from among the repeaters E1-E6. In one embodiment, the first repeater is one of the repeaters E4, E5, and E6 that are in a stage farthest from the signal source 2 and closest to the sinks S1, S2, and S3. In such an embodiment, as the optimization process continues and a next repeater is selected, the repeaters are selected in the first direction, or in a direction from farthest-to-closest to the signal source 2. However, in an alternative embodiment, the repeaters are selected in an order in the second direction from closest-to-farthest from the signal source 2. For example, in the alternative embodiment, the first repeater is the repeater E1, the next repeater selected is one of the repeaters E2 and E3, etc.

In operation 32, the selected repeater is analyzed to determine whether it has a positive slack. In other words, the selected repeater is analyzed to determine the difference between a required time and an arrival time of a signal generated by the selected repeater. A positive slack at the selected repeater implies that the arrival time of the signal generated by the repeater may be increased without affecting the overall delay of the circuit. If a positive slack exists at the selected repeater, or if the positive slack is greater than a predetermined threshold, then the selected repeater is swapped for a repeater having a higher threshold voltage ($V_{TH}$), thereby drawing less power.

After the selected repeater is swapped for a repeater having a higher $V_{TH}$, it is determined in operation 33 whether the swap has created any timing violations. In other words, the slack at the repeater is analyzed to determine whether a positive slack still exists at the repeater, or whether the positive slack is above a predetermined threshold. In addition, the slew of the repeater is analyzed to determine whether the slew of the repeater is less than a predetermined threshold. If there exists a slack or a slew timing violation, then the original selected repeater replaces the repeater having the higher $V_{TH}$ in operation 34. However, if it is determined in operation 33 that no slack or slew timing violations have been created, then the repeater having the higher $V_{TH}$ is kept in the tree 4, and it is determined in operation 35 if the last repeater in the tree 4 has been optimized.

If the last repeater in the tree 4 has been optimized, then the $V_{TH}$-swap power optimization is ended. If not, then the next repeater is selected in operation 36, and the swapping and slack/slew analyses repeat until each repeater in the tree 4 has been optimized.

Figure 4:
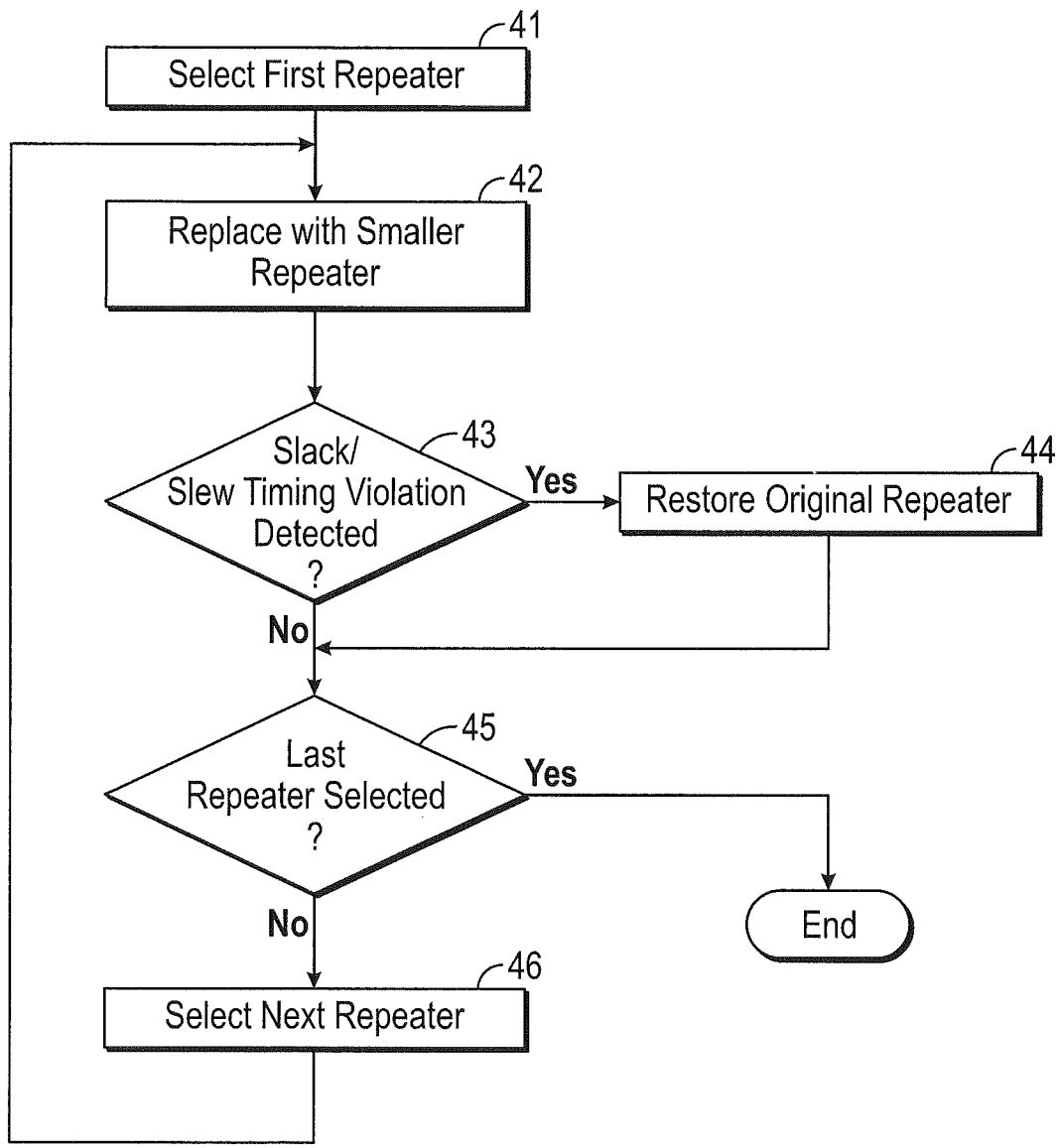
FIG. 4 is a flowchart of a method of optimizing power according to another embodiment.

FIG. 4 illustrates a method of power optimization according to another embodiment of the disclosure. In a power-down process illustrated in FIG. 4, a first repeater is selected in operation 41 from among the repeaters E1-E6. In one embodiment, the first repeater is one of the repeaters E4, E5, and E6 that are in a stage farthest from the signal source 2 and closest to the sinks S1, S2, and S3. In such an embodiment, as the optimization process continues and a next repeater is selected, the repeaters are selected in the first direction, or in a direction from farthest-to-closest to the signal source 2. However, in an alternative embodiment, the repeaters are selected in an order in the second direction from closest-to-farthest from the signal source 2. For example, in the alternative embodiment, the first repeater is the repeater E1, the next repeater selected is one of the repeaters E2 and E3, etc.

In operation 42, the selected repeater is analyzed to determine whether it has a positive slack. If a positive slack exists at the selected repeater, or if the positive slack is greater than a predetermined threshold, then the selected repeater is replaced with a repeater having a smaller size than the selected repeater, since a smaller repeater draws less power.

After the selected repeater is replaced with a smaller repeater, it is determined in operation 43 whether the replacement has created any timing violations. In other words, the slack at the repeater is analyzed to determine whether a positive slack still exists at the repeater, or whether the positive slack is above a predetermined threshold. In addition, the slew of the repeater is analyzed to determine whether the slew of the repeater is less than a predetermined threshold. If there exists a slack or a slew timing violation, then the original selected repeater replaces the smaller repeater in operation 44. However, if it is determined in operation 43 that no slack or slew timing violations have been created, then the smaller repeater is kept in the tree 4, and it is determined in operation 45 if the last repeater in the tree 4 has been optimized.

If the last repeater in the tree 4 has been optimized, then the power-down optimization is ended. If not, then the next repeater is selected in operation 46, and the power-down and slack/slew analyses repeat until each repeater in the tree 4 has been optimized.

In one embodiment of the disclosure, the power optimization analysis 22 of FIG. 2 includes first the repeater-swap power optimization method and then the power-down power optimization method. In another embodiment, the power-down power optimization method is only performed on a repeater if the repeater is a higher-$V_{TH}$ repeater resulting from the repeater-swap power optimization. In other words, in one embodiment repeaters that resulted in a slack/slew violation in the repeater-swap optimization method are excluded from the power-down optimization analysis. In yet another embodiment, the power-down power optimization method is performed first, and then the repeater-swap power optimization method is performed. In yet another embodiment, only one of the repeater-swap power optimization analysis or the power-down power optimization analysis is performed.

In some embodiments of the disclosure, one or more limits are applied to the power optimization analysis 22. For example, in one embodiment, the power optimization analysis 22 is not applied to any repeater driving a net that couples to other nets, and for which an aggressor timing window overlaps a sink timing window, where an aggressor refers to a line, wire, or net whose switching affects the switching of another line, wire, or net, referred to as the victim, in proximity to the aggressor. In yet another embodiment, a repeater is only swapped to a higher $V_{TH}$ or powered down if output and input nets do not have overlapping timing windows of an aggressor source and sink victim.

While the repeater-swap and power-down power optimization methods have been described as examples of power optimization analyses of operation 22 in FIG. 2, embodiments of the present disclosure encompass any power optimization analysis in which the power of repeaters in a net is reduced.

Referring again to FIG. 2, since changing repeater characteristics may result in new slack and slew characteristics in the tree 4, in embodiments of the present disclosure a crosstalk analysis is performed in operation 23 to detect new crosstalk timing violations. Since crosstalk may occur when lines of the tree 4 have simultaneous switching events, the likelihood of simultaneous switching events may be calculated or estimated to determine whether crosstalk timing violations exist.

There are at least two approaches to calculate the impact of crosstalk on timing propagation. In one approach coupling capacitances along nets of the tree 4 are multiplied by a coupling k factor which is calculated based on the overlap of timing windows of signals propagated along the nets of the tree 4.

In another approach, the delay through a victim net of the tree 4 is adjusted if an aggressor signal of another net of the tree 4 is found to overlap the victim signal at a sink of interest. The amount of timing adjust is determined by the noise created at the victim sink by the aggressor. A noise waveform is overlapped with the timing slew transition to determine the amount of adjust added to the victim net source-sink delay. Likewise, a similar adjust is also applied to the sink slew.

While two approaches to determining crosstalk timing violations are described above, embodiments of the disclosure include any method of determining crosstalk timing violations in nets of the tree 4.

In the crosstalk analysis of operation 23, the nets of the tree 4 are analyzed for crosstalk violations and if crosstalk violations are detected in a net, it is determined whether repeaters of the net have been swapped or powered down in operation 22. If so, one or more repeaters are replaced with repeaters having a lower $V_{TH}$ or a larger size. For example, in one embodiment repeaters that have been replaced with repeaters having a higher $V_{TH}$ or a smaller size are restored to an original lower $V_{TH}$ or an original larger size. In other words, the power optimization is reversed if it is determined that the power optimization resulted in crosstalk timing violations.

In operation 24, it is determined whether any new slack/slew timing violations exist after performing the crosstalk analysis of operation 23. If no timing violations are detected in operation 24, the model circuit may be stored or transmitted to a fabrication assembly in operation 25 to fabricate the circuit based on the model circuit that has been optimized for low power consumption and crosstalk.

On the other hand, if it is determined in operation 24 that new timing violations exist, the timing violations are addressed in operation 26 by replacing the repeaters causing the timing violations with repeaters having a larger size or lower $V_{TH}$. After addressing the timing violations in operation 26, the crosstalk analysis is repeated in operation 23, and the process is repeated until the model circuit is optimized for low power consumption and crosstalk.

In the embodiments described in FIGS. 2-4, each repeater is optimized for low power consumption, and the crosstalk analysis is performed after all of the repeaters are optimized for low power consumption. In alternative embodiments, crosstalk analysis may be performed after each repeater is optimized for low power consumption.

Figure 5:
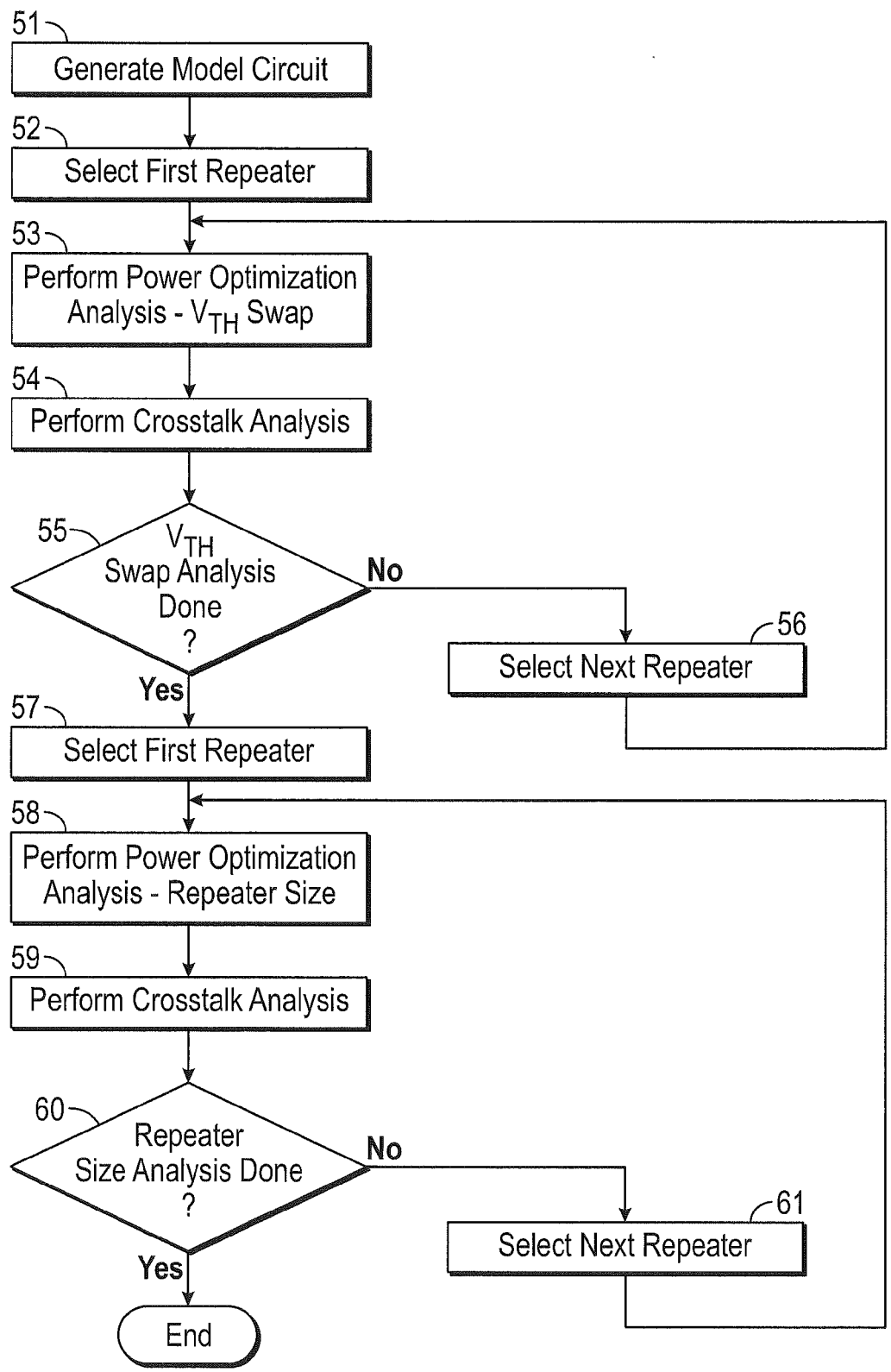
FIG. 5 is a flowchart of a method of optimizing power and reducing crosstalk according to another embodiment.

FIG. 5 illustrates a method of optimizing a model circuit for low power consumption and crosstalk according to one embodiment of the disclosure. In operation 51, a model circuit is generated and a crosstalk analysis is performed on the model. The circuit design may be, for example, a software modeling of an actual circuit prior to fabricating the actual circuit. The design may include one or more repeaters E1-E6, and for purposes of describing the present embodiment, the circuit illustrated in FIG. 1 will be referred to as an example circuit design.

In operation 52 a first repeater is selected from among the repeaters E1-E6. In one embodiment, the first repeater is one of the repeaters E4, E5, and E6 that are in a stage farthest from the signal source 2 and closest to the sinks S1, S2, and S3. In such an embodiment, as the optimization process continues and a next repeater is selected, the repeaters are selected in the first direction, or in a direction from farthest-to-closest to the signal source 2. However, in an alternative embodiment, the repeaters are selected in an order in the second direction from closest-to-farthest from the signal source 2. For example, in the alternative embodiment, the first repeater is the repeater E1, the next repeater selected is one of the repeaters E2 and E3, etc.

In operation 53, a repeater-swap power optimization process is performed. FIG. 3 illustrates such a process. In operation 54, a crosstalk analysis is performed. Such an analysis is described above with respect to operations 23-26 of FIG. 2.

In operation 55, it is determined whether the repeater-swap power optimization analysis is completed. If not, then a next repeater is selected in operation 56, and the power optimization and crosstalk analysis processes are repeated. If it is determined in operation 55 that the repeater-swap power optimization analysis is completed, then a power-down power optimization process begins.

In operation 57, a first repeater is selected from among the repeaters E1-E6. In operation 58, the power-down power optimization analysis is performed, as described in FIG. 4, for example. In operation 59, a crosstalk analysis is performed, as described above with respect to operations 23-26 of FIG. 2. In operation 60, it is determined whether the power-down power optimization process is completed. If not, then a next repeater is selected in operation 61. However, if the power down power optimization process is complete, the power optimization and crosstalk analysis ends, and the model circuit may be provided to a fabrication assembly, for example, to fabricate the low power optimized circuit.

Embodiments of the present disclosure include methods and processes carried out to reduce the power consumption of a circuit based on a model circuit. The methods and processes may be carried out by any computer, machine, or assembly of one or more computers and machines equipped and configured to perform circuit modeling, power optimization analysis of a circuit, and crosstalk analysis of a circuit.

Figure 6:
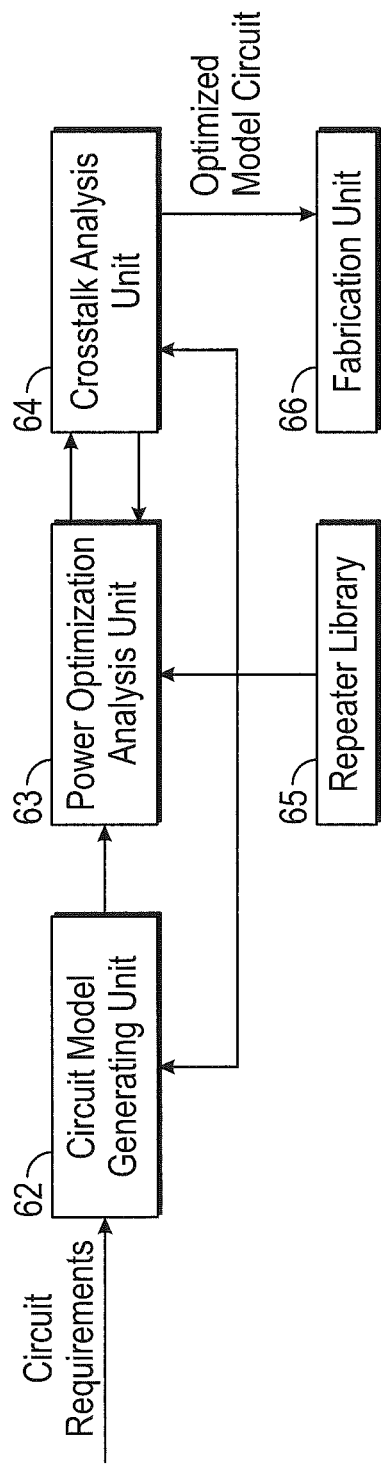
FIG. 6 depicts a system according to one embodiment.

A computer, machine, or assembly according to embodiments of the disclosure includes at least a processor, memory, and supporting logic to receive circuit data, to generate a model of a circuit based on the circuit data, to analyze the circuit power and crosstalk characteristics, and to retrieve stored repeater data. FIG. 6 illustrates an assembly according to one embodiment of the disclosure.

The assembly includes a circuit model generating unit 62 that receives circuit requirements and generates a model of the circuit. For example, the circuit model generating unit 62 may be connected to a user input or may include a user input. A user input may include interfaces such as a keyboard, mouse, or other interfaces to allow a user to select or generate one or more components of a circuit and specify circuit requirements, such as slack, slew, and crosstalk requirements, as well as power requirements and circuit structure. The circuit model generating unit 62 may include a processor, memory, logic, a display, and other components necessary to generate a model of a circuit based on received circuit requirements.

The circuit model generated by the circuit model generating unit is used by the power optimization analysis unit 63 to replace repeaters in the circuit model with repeaters having lower power requirements. The low-power circuit model generated by the power optimization analysis unit 63 is accessed by the crosstalk analysis unit 64 to determine whether any crosstalk violations exist, and the circuit model resulting from the crosstalk analysis may be fed back to the power optimization analysis unit 63 for further power analysis.

The repeater library 65 includes information regarding repeaters having varying $V_{TH}$ values and varying sizes. The circuit model generating unit 62, power optimization analysis unit 63, and crosstalk analysis unit 64 all may access the repeater library 65 to replace repeaters in the circuit model with alternative repeaters from the repeater library 65. The circuit model generating unit 62, power optimization analysis unit 63, and crosstalk analysis unit 64 may be separate hardware modules including separate processors, memory, supporting logic, displays, interfaces, and other circuitry.

Alternatively, one or more of the circuit model generating unit 62, power optimization analysis unit 63, and crosstalk analysis unit 64 may include software programs stored in memory and a processor to access the software programs to perform the separate modeling and/or analysis operations of the different units. For example, in one embodiment, the power optimization analysis unit 63 and crosstalk analysis unit 64 include programs stored in memory, and each is respectively accessed by a processor to analyze the model circuit and access the repeater library 65 to modify the model circuit, which may be stored as a file or program at another location in memory. Similarly, the repeater library 65 may include a separate memory module, or may be stored in the same memory module, chip, circuit, or drive as one or more of the circuit model generating unit 62, power optimization analysis unit 63, and crosstalk analysis unit 64.

Upon completion of the analyses, the crosstalk analysis unit 64 may transmit the optimized circuit model to a fabrication assembly 66, which may include, for example, a production line, a material deposition chamber, a photolithographic device, an etching device, a laser etching device, or any other device or assembly to form a physical circuit based on the circuit model.

Embodiments of the present disclosure encompass computer programs and computer-readable media that store computer programs or code that control a machine, computer, or assembly to generate a circuit model, perform power analysis, and perform crosstalk analysis of the circuit model. Examples of computer-readable media include volatile and non-volatile memory, optical and magnetic disks, flash memory, and other memory to store data and control a machine, computer, or assembly to perform the above processes and methods.

The flowchart and block diagrams in the Figures illustrate the architecture, functionality, and operation of possible implementations of systems and methods according to various embodiments of the present disclosure. The diagrams depicted herein are just examples. There may be many variations to these diagrams or the steps (or operations) described therein without departing from the spirit of the disclosure. For instance, the steps may be performed in a differing order, or steps may be added, deleted or modified. All of these variations are considered a part of the claimed embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
    generating a model of a circuit including a plurality of original repeaters connected between at least one source and at least one sink;
    wherein a subset of said plurality of original repeaters are original repeaters that drive a net in the model of the circuit that couples to other nets in the model of the circuit;
    performing, with a power optimization unit, a power optimization analysis on the plurality of original repeaters that are not in said subset to change the plurality of non-subset original repeaters to low-power repeaters based on predetermined optimization parameters;
    wherein said power optimization unit is configured to withhold said power optimization analysis from said plurality of subset original repeaters that are original repeaters that drive a net in the model of the circuit that couples to other nets in the model of the circuit;
    performing, with a crosstalk analysis unit, a crosstalk analysis on the model of the circuit including the low-power repeaters to determine whether said change of the plurality of non-subset original repeaters to low-power repeaters resulted in a crosstalk timing violation; and
    changing, with the crosstalk analysis unit, at least one of the low-power repeaters to a higher-power repeater when it is determined that said change of the plurality of non-subset original repeaters to low-power repeaters resulted in a crosstalk violation, and leaving the low-power repeaters in the model of the circuit when it is determined that said change of the plurality of non-subset original repeaters to low-power repeaters did not result in a crosstalk violation.

2. The method of claim 1, further comprising:
    repeating performing the crosstalk analysis and changing the at least one of the low-power repeaters until no crosstalk violations are detected.

3. The method of claim 1, further comprising:
    detecting whether slack and slew violations exist in the model of the circuit after performing the crosstalk analysis on the model of the circuit;
    replacing at least one of the low-power repeaters to address a slack or slew violation when the slack or slew violation is detected; and
    re-performing the cross-talk analysis on the model of the circuit after replacing the at least one of the low-power repeaters to address the slack or slew violation.

4. The method of claim 1, wherein performing the power optimization analysis comprises:
    selecting at least one repeater from among the plurality of original repeaters;
    replacing the at least one repeater with a low-power repeater having a higher threshold voltage ($V_{TH}$) than the at least one repeater;

detecting whether a slack or slew timing violation exists; and replacing the low-power repeater having the higher $V_{TH}$ with the at least one repeater when a slack or slew violation exists, and keeping the low-power repeater having the higher $V_{TH}$ in the model of the circuit when no slack or slew timing violation exists.

5. The method of claim 1, wherein performing the power optimization analysis comprises:
selecting at least one repeater from among the plurality of original repeaters;
replacing the at least one repeater with a low-power repeater having a smaller size than the at least one repeater;
detecting whether a slack or slew timing violation exists; and
replacing the low-power repeater having the smaller size with the at least one repeater when a slack or slew violation exists, and keeping the low-power repeater having the smaller size in the model of the circuit when no slack or slew timing violation exists.

6. The method of claim 1, wherein performing the power optimization analysis comprises:
replacing the at least one repeater with a low-power repeater having a higher voltage threshold ($V_{TH}$) than the at least one repeater; and
replacing the low-power repeater having the higher $V_{TH}$ with a lower-power repeater having a smaller size than the low-power repeater having the higher $V_{TH}$.

7. The method of claim 1, wherein performing the power optimization analysis includes:
selecting each one of the plurality of original repeaters to be analyzed one at a time in a direction from sink to source.

8. The method of claim 1, wherein performing the power optimization analysis includes:
selecting each one of the plurality of original repeaters to be analyzed one at a time in a direction from source to sink.

9. The method of claim 1, wherein performing the power optimization analysis comprises:
determining whether each original repeater of the model of the circuit is to be a subject of performing the power optimization, and excluding an original repeater from among the plurality of original repeaters from being a subject of the power optimization based on at least one of the following:
an aggressor timing window of one of the nets in the model of the circuit overlaps a sink timing window of another of the nets in the circuit; and
output and input nets of the original repeater from among the plurality of repeaters have overlapping timing windows.

10. The method of claim 1, wherein performing the power optimization comprises:
determining whether each original repeater of the model of the circuit is to be a subject of performing the power optimization, and excluding an original repeater from among the plurality of repeaters from being a subject of the power optimization based on each one of the following:
an aggressor timing window of one of the nets in the model of the circuit overlaps a sink timing window of another of the nets in the circuit; and
output and input nets of the original repeater from among the plurality of original repeaters have overlapping timing windows.

11. The method of claim 1, wherein performing the power optimization analysis and performing the crosstalk analysis comprise:
performing a power optimization analysis of each one of the plurality of original repeaters; and
performing the crosstalk analysis on each one of the plurality of original repeaters after the power optimization analysis is performed on all of the plurality of original repeaters.

12. The method of claim 1, wherein performing the power optimization analysis and performing the crosstalk analysis comprise:
performing a power optimization analysis of each one of the plurality of original repeaters; and
performing the crosstalk analysis on each one of the plurality of original repeaters respectively after the power optimization analysis is performed on each one of the plurality of original repeaters respectively.

13. The method of claim 1, wherein performing the crosstalk analysis and changing at least one of the low-power repeaters to a higher-power repeater comprise:
changing the at least one of the low-power repeaters to a repeater having a lower $V_{TH}$;
re-performing the crosstalk analysis; and
changing the repeater having the lower $V_{TH}$ to a larger repeater when it is determined that a crosstalk timing violation exists, and leaving the repeater having the lower $V_{TH}$ in the model of the circuit when it is determined that no crosstalk timing violation exists.

14. The method of claim 1, wherein performing the power optimization analysis comprises first determining whether to replace one of the plurality of original repeaters with a repeater having a higher $V_{TH}$ and then determining whether to replace the one of the plurality of repeaters having a higher $V_{TH}$ with a repeater having a smaller size; and
changing the at least one of the low-power repeaters to a higher-power repeater comprises first replacing the one of the low-power repeaters with a repeater having a larger size, and then determining whether to replace the repeater having the larger size with a repeater having a lower $V_{TH}$.

* * * * *